(12) United States Patent
Kwon et al.

(10) Patent No.: US 12,347,759 B2
(45) Date of Patent: Jul. 1, 2025

(54) SEMICONDUCTOR PACKAGE AND SUBSTRATE FOR SEMICONDUCTOR PACKAGE

(71) Applicant: Samsung Electronics Co., Ltd., Suwon-si (KR)

(72) Inventors: Jin Mo Kwon, Yongin-si (KR); Dong Uk Kim, Seoul (KR); Jin Hee Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 209 days.

(21) Appl. No.: 17/590,954

(22) Filed: Feb. 2, 2022

(65) Prior Publication Data
US 2022/0415774 A1    Dec. 29, 2022

(30) Foreign Application Priority Data
Jun. 24, 2021   (KR) ................. 10-2021-0082450

(51) Int. Cl.
*H01L 23/498*   (2006.01)
*H01L 23/00*    (2006.01)
*H01L 25/065*   (2023.01)

(52) U.S. Cl.
CPC .. *H01L 23/49822* (2013.01); *H01L 23/49811* (2013.01); *H01L 23/49838* (2013.01);
(Continued)

(58) Field of Classification Search
CPC .......... H01L 23/49816; H01L 23/5383; H01L 23/5386; H01L 23/49822; H01L 23/49811;
(Continued)

(56) References Cited

U.S. PATENT DOCUMENTS 5,870,289 A    2/1999  Tokuda et al.
6,259,608 B1 *  7/2001  Berardinelli ........... H05K 1/111
                                                 174/250

(Continued)

FOREIGN PATENT DOCUMENTS

JP    2008-227429 A    9/2008
KR    10-1131138 B1   4/2012
(Continued)

OTHER PUBLICATIONS

Korean Office Action dated Apr. 22, 2025 for corresponding Korean Application No. 10-2021-0082450.

*Primary Examiner* — Shaun M Campbell
*Assistant Examiner* — Teresa M. Arroyo
(74) *Attorney, Agent, or Firm* — Harness, Dickey & Pierce, P.L.C.

(57) ABSTRACT

A semiconductor package includes a substrate; a semiconductor chip on a first surface of the substrate; and a plurality of external connection terminals on a second surface of the substrate that is opposite to the first surface. The substrate includes a plurality of wirings configured to electrically connect the semiconductor chip and the plurality of external connection terminals. The plurality of wirings includes a first wiring, and the first wiring includes a first portion and a second portion connected to each other, the second portion overlapping an edge of the semiconductor chip in a vertical direction that is perpendicular to the first surface of the substrate. A second width of the second portion is greater than a first width of the first portion.

19 Claims, 14 Drawing Sheets

(52) U.S. Cl.
CPC .............. *H01L 24/48* (2013.01); *H01L 24/32* (2013.01); *H01L 24/33* (2013.01); *H01L 25/0657* (2013.01); *H01L 2224/32145* (2013.01); *H01L 2224/32225* (2013.01); *H01L 2224/33181* (2013.01); *H01L 2224/48227* (2013.01); *H01L 2225/0651* (2013.01); *H01L 2225/06562* (2013.01); *H01L 2924/3511* (2013.01); *H01L 2924/3512* (2013.01)

(58) Field of Classification Search
CPC .............. H01L 23/49838; H01L 23/528; H01L 2924/15311; H01L 2924/00014; H01L 2924/181; H01L 2924/3511; H01L 2924/3512; H01L 24/48; H01L 24/32; H01L 24/33; H01L 25/0657; H01L 2224/02331; H01L 2224/02373; H01L 2224/02375; H01L 2224/48091; H01L 2224/73265; H01L 2224/83191; H01L 2224/8592; H01L 2224/32145; H01L 2224/32225; H01L 2224/33181; H01L 2224/48227; H01L 24/73; H01L 24/02; H01L 2225/0651; H01L 2225/06562; H01L 2924/00012; H01L 2224/45099; H05K 1/0209; H05K 1/0271; H05K 5/0247; H05K 7/02; H05K 2201/0364
USPC .................................. 361/719, 720, 736, 748
See application file for complete search history.

(56) References Cited

U.S. PATENT DOCUMENTS

| | | | |
|---|---|---|---|
| 6,664,483 B2 | 12/2003 | Chong et al. | |
| 6,869,286 B2 | 3/2005 | Furry | |
| 7,087,844 B2 | 8/2006 | Ishimaru et al. | |
| 9,129,972 B2 | 9/2015 | Cho et al. | |
| 10,580,749 B2 | 3/2020 | Pendse | |
| 10,861,783 B1* | 12/2020 | Kim | H05K 3/181 |
| 2003/0030516 A1* | 2/2003 | Tsukiyama | H01L 23/66 |
| | | | 333/247 |
| 2003/0235044 A1* | 12/2003 | Amir | H01L 23/5386 |
| | | | 361/767 |
| 2004/0155322 A1* | 8/2004 | Cho | H01L 23/49816 |
| | | | 257/676 |
| 2008/0199988 A1* | 8/2008 | Ito | H05K 3/3485 |
| | | | 29/844 |
| 2009/0166879 A1 | 7/2009 | Song et al. | |
| 2009/0236031 A1* | 9/2009 | Sunohara | H01L 23/5389 |
| | | | 156/182 |
| 2009/0278630 A1* | 11/2009 | Koch | H01P 3/08 |
| | | | 333/204 |
| 2010/0155113 A1* | 6/2010 | Kamei | H05K 1/0271 |
| | | | 174/255 |
| 2015/0194379 A1* | 7/2015 | Chen | H01L 24/16 |
| | | | 257/668 |
| 2017/0064832 A1* | 3/2017 | Lee | H01L 23/5383 |
| 2018/0240751 A1* | 8/2018 | Harr | H01L 23/3171 |
| 2022/0199505 A1* | 6/2022 | Kim | H01L 23/49816 |

FOREIGN PATENT DOCUMENTS

| | | |
|---|---|---|
| KR | 2013-0084359 A | 7/2013 |
| KR | 2018-0096392 A | 8/2018 |

* cited by examiner

SEMICONDUCTOR PACKAGE AND SUBSTRATE FOR SEMICONDUCTOR PACKAGE

CROSS-REFERENCE TO RELATED APPLICATION

This application claims priority under 35 U.S.C. § 119 from Korean Patent Application No. 10-2021-0082450 filed on Jun. 24, 2021 in the Korean Intellectual Property Office, and all the benefits accruing therefrom under 35 U.S.C. 119, the contents of which in its entirety are herein incorporated by reference.

BACKGROUND

1. Technical Field

The present inventive concepts relates to a semiconductor package and a substrate for a semiconductor package.

2. Description of the Related Art

According to the recent trend of miniaturization and weight reduction of electronic components, reduction of a semiconductor package mounted thereon is also required. In addition, the thickness of a substrate for a semiconductor package is also gradually decreasing, and accordingly, it is becoming more difficult to control the warpage of the substrate.

In particular, since a semiconductor chip is mounted in a mounting area of the substrate for the semiconductor package, the mounting area is relatively stiff compared to the non-mounting area in which the semiconductor chip is not mounted. A warpage difference may occur between the mounting area and the non-mounting area, and cracks may occur due to repeated bending and stretching along the edge of the mounting area.

SUMMARY

Some example embodiments of the present inventive concepts provide a semiconductor package that reduces or minimizes the occurrence of cracks based on reducing the warpage difference between the mounting area and the non-mounting area.

Some example embodiments of the present inventive concepts also provide a substrate for a semiconductor package that reduces or minimizes the occurrence of cracks based on reducing the warpage difference between the mounting area and the non-mounting area.

However, example embodiments of the present inventive concepts are not restricted to those set forth herein. The above and other aspects of the present inventive concepts will become more apparent to one of ordinary skill in the art to which the present inventive concepts pertain by referencing the detailed description of the present inventive concepts given below.

According to some example embodiments of the present inventive concepts, a semiconductor package may include: a substrate, a semiconductor chip on a first surface of the substrate, and a plurality of external connection terminals on a second surface of the substrate, where the first and second surfaces being opposite surfaces of the substrate. The substrate may include a plurality of wirings configured to electrically connect the semiconductor chip and the plurality of external connection terminals. The plurality of wirings may include a first wiring, and the first wiring may include a first portion and a second portion connected to each other, the second portion overlapping an edge of the semiconductor chip in a vertical direction that is perpendicular to the first surface of the substrate. The first portion may have a first width and the second portion may have a second width. The second width of the second portion may be greater than the first width of the first portion.

According to some example embodiments of the present inventive concepts, a semiconductor package may include: a substrate including a mounting area, a semiconductor chip in the mounting area on a first surface of the substrate, a plurality of pads outside the mounting area on the first surface of the substrate and connected to the semiconductor chip through wires, and a plurality of external connection terminals on a second surface of the substrate, where the plurality of external connection terminals include first and second terminals overlapping the mounting area in a vertical direction that is perpendicular to the first surface of the substrate, and third and fourth terminals not overlapping the mounting area in the vertical direction. The first and second surfaces may be opposite surfaces of the substrate. The substrate may include a plurality of wirings configured to electrically connect the plurality of pads and the plurality of external connection terminals. The plurality of wirings may include a first wiring, and the first wiring may extend from a position overlapping the mounting area in the vertical direction to a position not overlapping the mounting area in the vertical direction. The first wiring may include a first portion, a second portion and a third portion connected to each other, the first portion being between the first terminal and the second terminal, the third portion being between the third terminal and the fourth terminal, the second portion being in a space surrounded by the first to fourth terminals. The first portion may have a first width, the second portion may have a second width, and the third portion may have a third width, and the second width of the second portion may be greater than the first width of the first portion and the third width of the third portion.

According to some example embodiments of the present inventive concepts, a substrate in which a plurality of wiring layers and insulating layers are alternately arranged may include: a plurality of alignment marks on the substrate and defining a mounting area in which a semiconductor chip is to be mounted. The plurality of wiring layers may include a first wiring, and the first wiring may extend from a position overlapping the mounting area in a vertical direction that is perpendicular to a first surface of the substrate to a position not overlapping the mounting area in the vertical direction. The first wiring may include a first portion and a second portion connected to each other, the second portion being at a position overlapping an edge of the mounting area in the vertical direction. The first portion may have a first width and the second portion may have a second width. The second width of the second portion may be greater than the first width of the first portion.

BRIEF DESCRIPTION OF THE DRAWINGS

The above and other aspects and features of the present inventive concepts will become more apparent by describing in detail some example embodiments thereof with reference to the attached drawings, in which.

DETAILED DESCRIPTION

Figure 1:
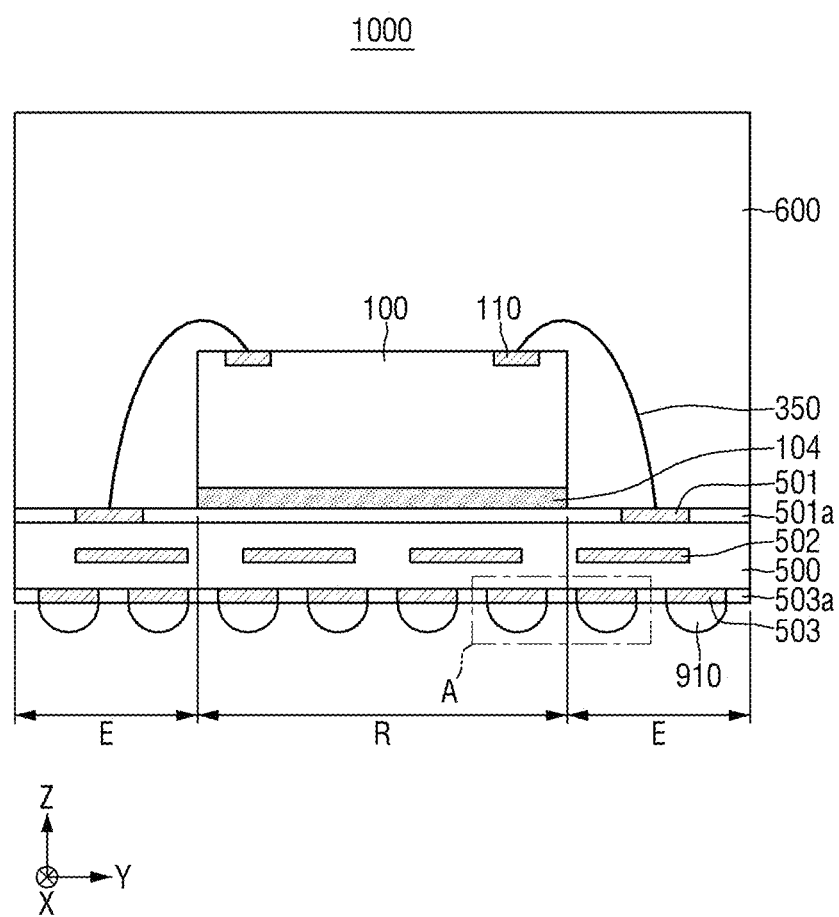
FIG. 1 is a cross-sectional view illustrating a semiconductor package according to some example embodiments of the present inventive concepts.

Hereinafter, some example embodiments of the present inventive concepts will be described in detail with reference to the accompanying drawings. In the drawings, the same components are denoted by the same reference numerals, and redundant description thereof will be omitted.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
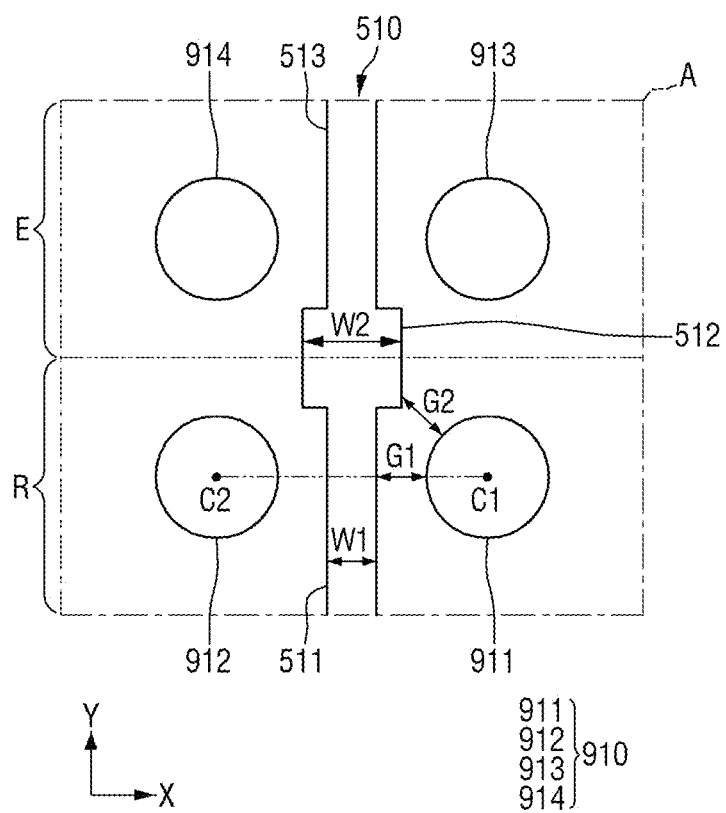
FIG. 2 is a bottom view of area A of FIG. 1.

FIG. 1 is a cross-sectional view illustrating a semiconductor package according to some example embodiments of the present inventive concepts. FIG. 2 is a bottom view of area A of FIG. 1.

First referring to FIGS. 1 and 2, a semiconductor package 1000 according to some example embodiments of the present inventive concepts includes a semiconductor chip 100, a substrate 500, a molding layer 600, and the like.

The semiconductor chip 100 is formed on one surface (e.g., a first surface, the top surface, etc.,) of the substrate 500. The substrate 500 includes a mounting area R in which the semiconductor chip 100 is mounted and a non-mounting area E in which the semiconductor chip 100 is not mounted around the mounting area R. The semiconductor chip 100 and the substrate 500 may be fixed to each other by an adhesive film 104. The adhesive film 104 may be, for example, a die adhesive film (DAF), but is not limited thereto. As shown, the substrate 500 may include a plurality of wiring layers (e.g., including wiring 502, wiring 510, etc.) and insulating layers that are alternately arranged (e.g., alternately arranged in the x-axis direction, the y-axis direction, and/or the z-axis direction).

A plurality of external connection terminals 910 are included on the other surface (e.g., a second surface which may be opposite to the first surface, the bottom surface, etc.,) of the substrate 500. It will be understood that the "one" and "other" surfaces (e.g., first and second surfaces) of the substrate 500 may be opposite surfaces of the substrate 500. The substrate 500 may include a plurality of wirings 501, 502, and 503 for electrically connecting the semiconductor chip 100 and the external connection terminal 910 (e.g., the plurality of wirings 501, 502, and 503, and which may further include the first wiring 510, may be configured to electrically connect the semiconductor chip 100 to the external connection terminals 910).

The plurality of wirings 501, 502, and 503 (which may further include the first wiring 510) are disposed in a plurality of layers (e.g., insulating layers, which may be alternately arranged with wiring layers). The plurality of wirings 501, 502, and 503 may be disposed in, for example, three layers, but is not limited thereto. For example, it may be two layers, or four layers or more.

One surface of the substrate 500 is covered with a passivation layer 501a, and a portion of the wiring 501 is not covered with the passivation layer 501a and is exposed. The exposed wiring 501 serves as a pad, and the exposed wiring 501 and a pad 110 of the semiconductor chip 100 are connected through a wire 350. Accordingly, it will be understood that the semiconductor package 1000 may include a plurality of pads (e.g., exposed wiring 501) outside the mounting area R on the same one surface of the substrate 500 on which the semiconductor chip 100 is mounted in the mounting area R, where the pads are connected to the semiconductor chip 100 through respective wires 350. The wirings 502, 503 may be understood to be configured to electrically connect the pads (e.g., wirings 501) and the external connection terminals 910.

The other surface of the substrate 500 is covered with a passivation layer 503a, and a portion of the wiring 503 is not covered by the passivation layer 503a and is exposed. The exposed wiring 503 is directly connected to the external connection terminal 910.

Here, referring to FIG. 2, the plurality of external connection terminals 910 may include a first terminal 911, a second terminal 912, a third terminal 913, and a fourth terminal 914.

The plurality of wirings may include a wiring 510, also referred to herein as a first wiring of the plurality of wirings. The wiring 510 and the exposed wiring 503 in direct contact with the terminals 911, 912, 913, and 914 may be disposed at the same wiring level (e.g., the lowermost layer among the plurality of wiring layers, which may be interchangeably referred to herein as a plurality of layers). Here, the wiring 510 is covered by the passivation layer 503a, but in order to describe the size and positional relationship of the wiring 510, the wiring 510 is illustrated together with the terminals 911, 912, 913, and 914.

The first terminal 911 to the fourth terminal 914 may be arranged in a matrix form. That is, the first terminal 911 and the second terminal 912 may be disposed side by side in the x-axis direction, and the third terminal 913 and the fourth terminal 914 may be disposed side by side in the x-axis direction. In addition, the first terminal 911 and the third terminal 913 are disposed side by side in the y-axis direction, and the second terminal 912 and the fourth terminal 914 are disposed side by side in the y-axis direction.

The first terminal 911 and the second terminal 912 may be disposed in the mounting area R (e.g., may overlap the mounting area R in the z-axis direction, or vertical direction), and the third terminal 913 and the fourth terminal 914 may be disposed in the non-mounting area E (e.g., may not overlap the mounting area R in the z-axis direction, or vertical direction). In FIG. 2, the mounting area R is illustrated at the bottom, and the non-mounting area E is illustrated at the top.

Among the plurality of wirings, the first wiring 510 may be elongated (e.g., may extend) from a position overlapping the mounting area R (e.g., in the z-axis direction or vertical direction) to a position overlapping the non-mounting area E (e.g., a position not overlapping the mounting area in the z-axis direction or vertical direction R, a position exposed from the mounting area R in the z-axis direction or vertical direction, etc.). After passing between the first terminal 911 and the second terminal 912, the first wiring 510 may be elongated to pass through the third terminal 913 and the fourth terminal 914.

The first wiring 510 includes a first portion 511, a second portion 512, and a third portion 513 connected to each other. The first portion 511 is disposed to pass between the first terminal 911 and the second terminal 912, and the third portion 513, which is connected to the second portion 512 is disposed to pass between the third terminal 913 and the fourth terminal 914. As shown, the first portion 511 may be between (e.g., may horizontally overlap, in the x-axis direction, with both of) the first terminal 911 and the second terminal 912, and the second portion 512 may be offset from (e.g., offset in the y-axis direction from, offset from an axis extending between, etc.) the first terminal 911 and the second terminal 912 such that the second portion 512 is not between and/or does not horizontally overlap (e.g., in the x-axis direction) with both the first terminal 911 and the second terminal 912. As shown in at least FIG. 2, the first wiring 510 may further extend between the third terminal 913 and the fourth terminal 914 in addition to extending between the first terminal 911 and the second terminal 912. The third portion 513 may be between (e.g., may horizontally overlap, in the x-axis direction, with both of) the third terminal 913 and the fourth terminal 914, and the second portion 512 may be offset from (e.g., offset in the y-axis direction from, offset from an axis extending between) the third terminal 913 and the fourth terminal 914 such that the second portion 512 is not between and/or does not horizontally overlap (e.g., in the x-axis direction) with both the third terminal 913 and the fourth terminal 914. The second portion 512 may be disposed at a boundary between the mounting area R and the non-mounting area E (e.g., a position overlapping the edge of the semiconductor chip). As described herein, an element overlapping another element may overlap the element in a vertical direction that is vertical to an in-plane direction of the substrate 500, which may be the same as one or more surfaces of the substrate 500. For example, as shown in FIGS. 1-2, where the second portion 512 is at a position overlapping the edge of the semiconductor chip 100, it will be understood that the second portion 512 may be located at a position overlapping the edge of the semiconductor chip 100 in a vertical direction that is perpendicular to at least the first surface of the substrate 500 on which the semiconductor chip 100 is formed, such that the second portion 512 may be understood to overlap the edge of the semiconductor chip 100 in the vertical direction. The vertical direction may be a z-axis direction that is perpendicular to both the x and y-axis directions shown in FIGS. 1-2. As shown, the first wiring 510 may be elongated (e.g., may extend) from a position overlapping the mounting area R in the vertical direction to a position overlapping the non-mounting area E in the vertical direction (e.g., a position not overlapping the mounting area R in the vertical direction, a position exposed from the mounting area R in the vertical direction, etc.).

Here, a second width W2 of the second portion 512 may be greater than a first width W1 of the first portion 511. The first and second widths W1 and W2 may each be a width in a horizontal direction (e.g., the x-axis direction and/or the y-axis direction) that is parallel to an in-plane direction of the substrate 500, which may be the same as one or more surfaces of the substrate 500. For example, the first and second widths W1 and W2 may each be a width in a horizontal direction that is parallel to at least the first surface of the substrate 500 on which the semiconductor chip 100 is formed. The horizontal direction may be parallel to at least one of the x-axis direction or the y-axis direction shown in FIG. 2. The third portion 513 may have a third width (which may be the same or different as the first width W1), and the second width W2 of the second portion 512 may be greater than both the first width W1 of the first portion 511 and the third width of the third portion 513.

When the second width W2 of the second portion 512 positioned at the boundary between the mounting area R and the non-mounting area E is increased, shear stress is reduced. For example, when the second width W2 of the second portion 512 is twice the first width W1 (e.g., W2=2W1), the shear stress is reduced to ½ compared to the case where the second width W2 of the second portion 512 is equal to the first width W1 (e.g., W2=W1). Accordingly, although a warpage difference occurs between the mounting area R and the non-mounting area E, the shear stress applied to the second portion 512 positioned at the boundary between the mounting area R and the non-mounting area E is small, and thus the possibility of occurrence of cracks is lowered. Here, the second width W2 of the second portion 512 may satisfy $W1<W2\leq 4W1$. This is because, when the second width W2 is greater than 4W1, the distance to the peripheral terminals 911, 912, 913, and 914 is too close, so that an electrical short may occur in the manufacturing process.

Meanwhile, since the first portion 511 passes between the first terminal 911 and the second terminal 912, a process margin must be considered for the first width W1 of the first portion 511. Accordingly, a first gap G1 between the first portion 511 and the first terminal 911 (where G1 may be a distance, such as a minimum distance, between the first portion 511 and the first terminal 911 in a horizontal direction, which may extend in one or both of the x and y-axis directions, which may be the same direction in which the first width W1 extends) may satisfy $0.5W1\leq G1\leq 1.5W1$. For example, the first gap G1 may have the same size as the first width W1 (e.g., G1=W1). The first gap G1 may be measured on an imaginary line connecting a center C1 of the first terminal 911 and a center C2 of the second terminal 912. When the first gap G1 is smaller than 0.5W1, the process margin is too small, and thus the first portion 511 and the first terminal 911 may be electrically shorted during the manufacturing process. In addition, when the first gap G1 is greater than 1.5W1, the first width W1 of the first portion 511 is relatively small, so that the first wiring 510 cannot stably transmit a signal and/or power.

In addition, a second gap G2 between the second portion 512 and the first terminal 911 may satisfy $0.5W1\leq G2\leq 1.5W1$. The second gate may be a distance, such as a minimum distance, between the second portion 512 and the first terminal 911 in a horizontal direction which may extend in one or both of the x and y-axis directions. For example, the second gap G2 may have the same size as the first width W1 (e.g., G2=W1). The second gap G2 may be measured on an imaginary line connecting the center C1 of the first terminal 911 and the center of the second portion 512. When the second gap G2 is smaller than 0.5W1, the process margin is too small, and thus the second portion 512 and the first terminal 911 may be electrically shorted during the manufacturing process. In addition, when a second gap G2 is greater than 1.5W1, the second width W2 of the second portion 512 is relatively too small, so that it is difficult to sufficiently reduce the shear stress applied to the second portion 512.

In the semiconductor package according to some example embodiments of the present inventive concepts, by increasing the width of the first wiring 510 positioned at the boundary between the mounting area R and the non-mounting area E, cracks due to warpage differences may be reduced or prevented between the mounting area and the non-mounting area.

Figure 3:
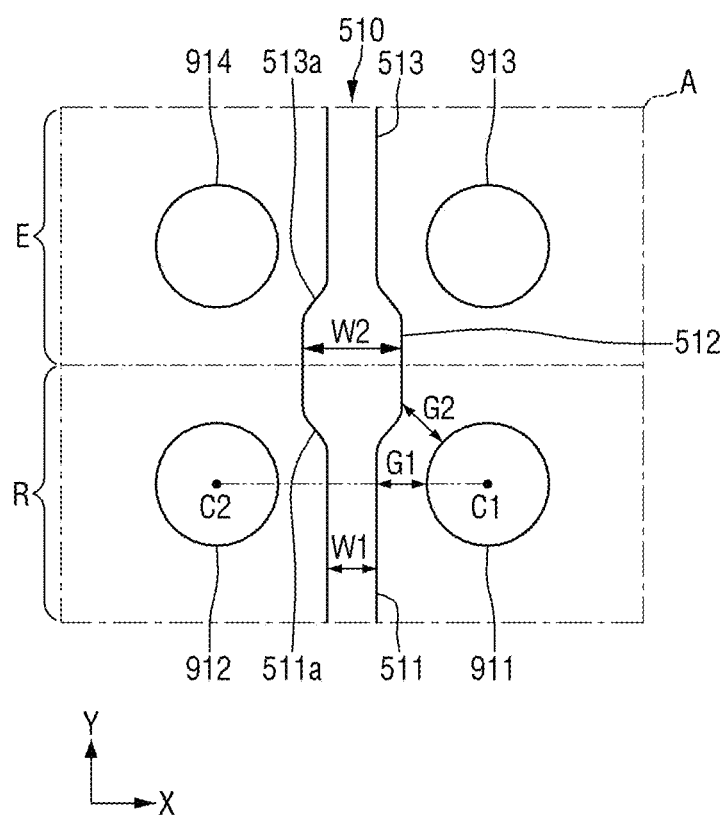
FIG. 3 is a bottom view illustrating a semiconductor package according to some example embodiments of the present inventive concepts.

FIG. 3 is a bottom view illustrating a semiconductor package according to some example embodiments of the present inventive concepts. For simplicity of description, the following description will focus on differences from the description with reference to FIGS. 1 and 2.

Referring to FIG. 3, the first wiring 510 includes the first portion 511 disposed between the first terminal 911 and the second terminal 912, the third portion 513 disposed between the third terminal 913 and the fourth terminal 914, and the second portion 512 disposed between the first portion 511 and the third portion 513 and, as shown in at least FIG. 3, disposed in a space surrounded by the terminals 911, 912, 913, and 914 (e.g., located within an area having an outer boundary defined by edges of the terminals 911, 912, 913, and 914 that are proximate to the second portion 512). Since the second width W2 of the second portion 512 is greater than the widths of the first portion 511 and third portion 513, a bridge area 511a having a width (e.g., width in the horizontal direction as described herein) increasing from the first width W1 to the second width W2 is further disposed between the first portion 511 and the second portion 512.

The width of the bridge area 511a may increase from the first width W1 at a position adjacent to the first portion 511 to the second width W2 at a position adjacent to the second portion 512. Accordingly, the first wiring 510 may be further understood to include the bridge area 511a. Similarly, a bridge area 513a having a gradually decreasing width (e.g., width in the horizontal direction as described herein) is further disposed between the second portion 512 and the third portion 513. Accordingly, the first wiring 510 may be further understood to include the bridge area 513a.

Figure 4:
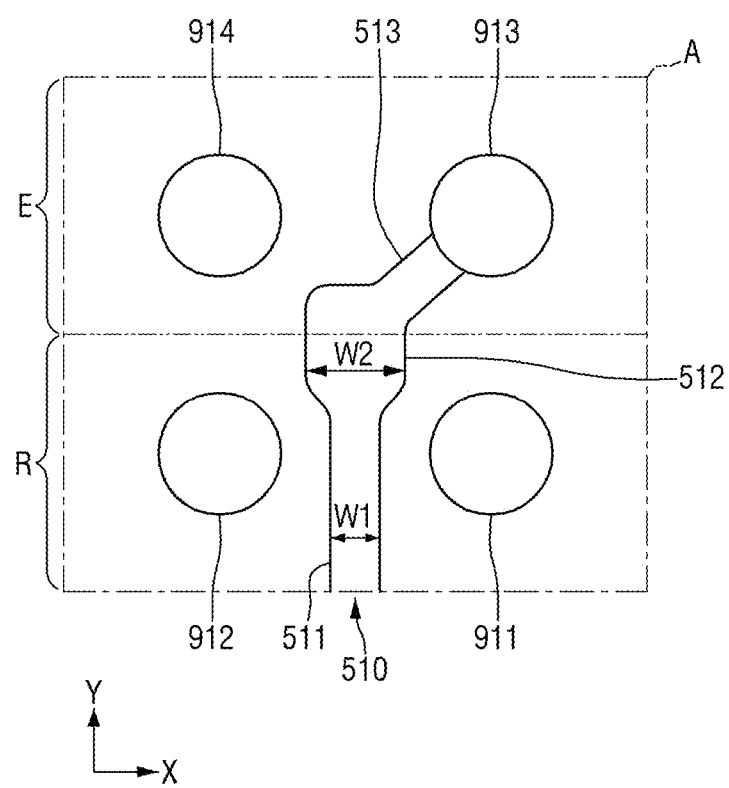
FIG. 4 is a bottom view illustrating a semiconductor package according to some example embodiments of the present inventive concepts.

FIG. 4 is a bottom view illustrating a semiconductor package according to some example embodiments of the present inventive concepts. For simplicity of description, the following description will focus on differences from the description with reference to FIGS. 1 and 2.

Referring to FIG. 4, the third portion 513 of the first wiring 510 is disposed in a direction different from the y-axis direction and is directly connected to the third terminal 913.

Since the second portion 512 has a greater width than the first portion 511 and/or the third portion 513, the third portion 513 may be easily connected to the second portion 512.

When there is no third portion 513, a connection portion between the first portion 511 extending in the y-axis direction and the third portion 513 extending in a direction different from the y-axis direction may be disposed at the boundary between the mounting area R and the non-mounting area E. Cracks may easily occur when such a connection portion is subjected to large shear stress. However, in the semiconductor package according to some example embodiments of the present inventive concepts, since the second portion 512 with a large width is disposed at the boundary, such a crack does not occur.

Figure 5:
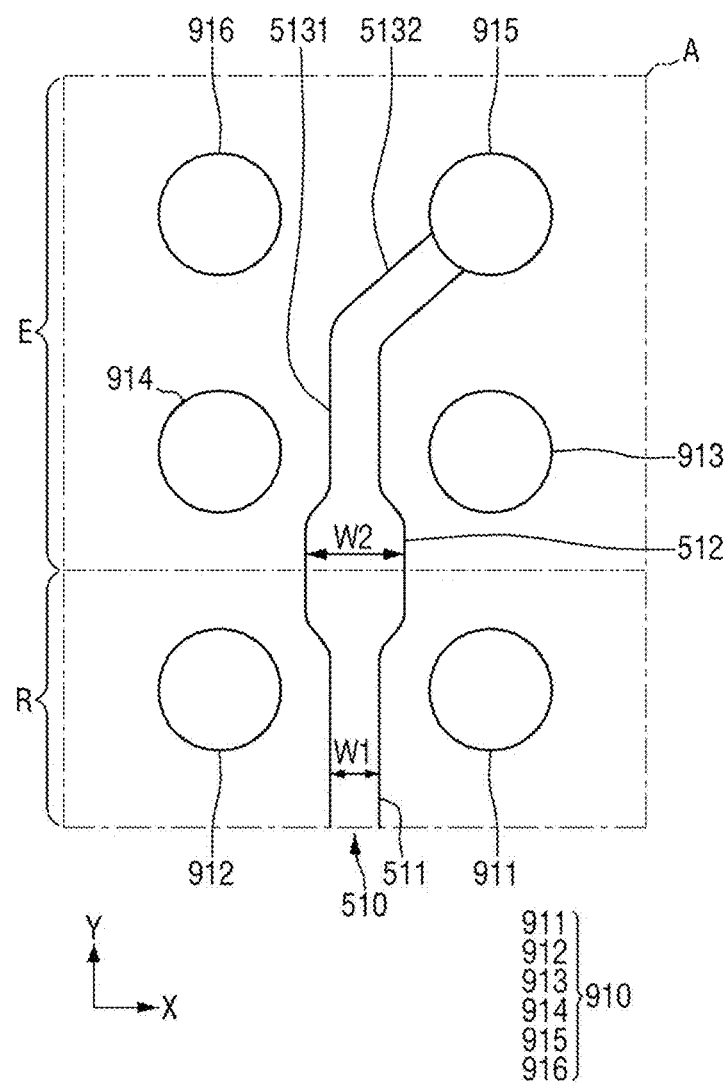
FIG. 5 is a bottom view illustrating a semiconductor package according to some example embodiments of the present inventive concepts.

FIG. 5 is a bottom view illustrating a semiconductor package according to some example embodiments of the present inventive concepts. For simplicity of description, the following description will focus on differences from the description with reference to FIGS. 1 to 3.

Referring to FIG. 5, the plurality of external connection terminals 910 may further include a fifth terminal 915 and a sixth terminal 916, and the first terminal 911 to the sixth terminal 916 may be arranged in a matrix form. The fifth terminal 915 and the sixth terminal 916 are disposed side by side in the x-axis direction, the first terminal 911, the third terminal 913, and the fifth terminal 915 are disposed side by side in the y-axis direction, and the second terminal 912, the fourth terminal 914, and the sixth terminal 916 are disposed side by side in the y-axis direction.

The third portion 513 of the first wiring 510 includes a portion 5131 passing between the third terminal 913 and the fourth terminal 914, and a portion 5132 curved to be coupled to the fifth terminal 915. Accordingly, the first wiring 510 may be directly connected to the fifth terminal 915 and may include a third portion, comprising at least the portions 5131 and 5132 in combination, which connects the second portion 512 and the fifth terminal 915. As shown in FIG. 5, a width (e.g., smallest width) of the third portion (comprising portions 5132 and 5131) may be smaller than the second width W2 of the second portion 512.

Figure 6:
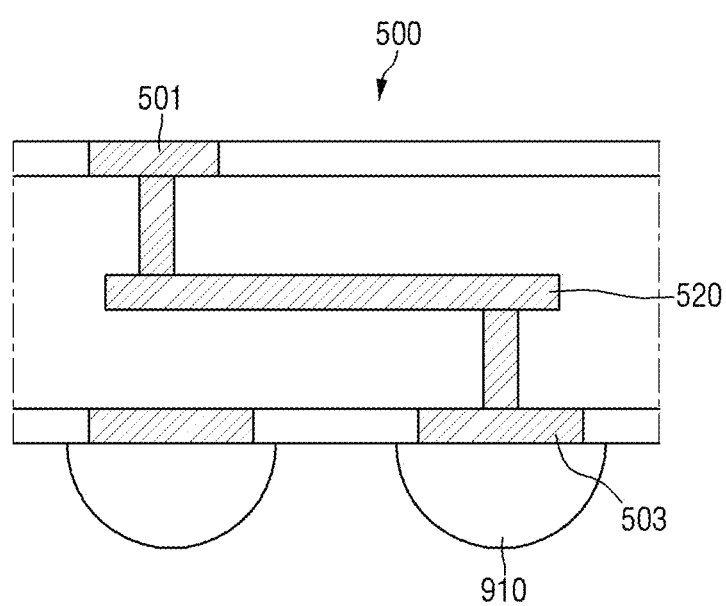
FIG. 6 is a cross-sectional view illustrating a substrate used in a semiconductor package according to some example embodiments of the present inventive concepts.
Figure 7:
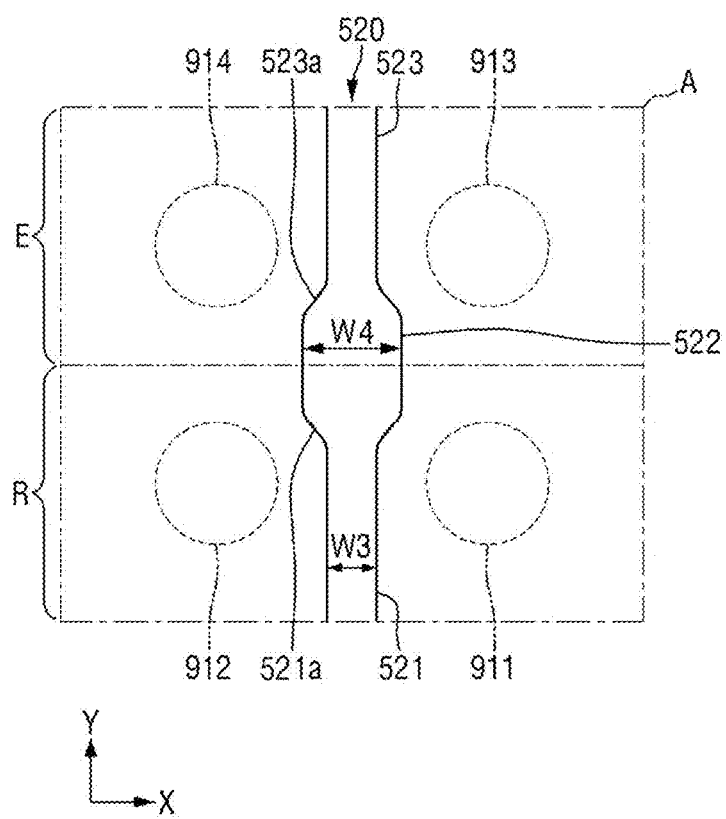
FIG. 7 is a bottom view illustrating a semiconductor package according to some example embodiments of the present inventive concepts.

FIG. 6 is a cross-sectional view illustrating a substrate used in a semiconductor package according to some example embodiments of the present inventive concepts. FIG. 7 is a bottom view illustrating a semiconductor package according to some example embodiments of the present inventive concepts. For simplicity of description, the following description will focus on differences from the description with reference to FIGS. 1 and 2.

In FIGS. 1 and 2, it is illustrated that the first wiring 510 is disposed at the lowermost layer among the plurality of wiring layers (e.g., a layer that is furthest from the semiconductor chip 100 in the z-axis direction). On the other hand, in FIG. 6, the second wiring 520 may be disposed at a layer (e.g., a middle wiring level) higher than the lowermost layer (e.g., closer to the semiconductor chip 100 in the z-axis direction than the lowermost layer which is the furthest from the semiconductor chip 100 in the z-axis direction) among the plurality of wiring layers. When the substrate 500 has, for example, three wiring levels, the second wiring 520 may be positioned at the second wiring level from the bottom.

In FIG. 7, the second wiring 520 includes a fourth portion 521, a fifth portion 522, and a sixth portion 523 connected to each other. The fourth portion 521 is disposed to pass between the first terminal 911 and the second terminal 912, and the sixth portion 523 is disposed to pass between the third terminal 913 and the fourth terminal 914. The fifth portion 522 may be disposed at a boundary between the mounting area R and the non-mounting area E (e.g., a position overlapping the edge of the semiconductor chip in the z-axis direction as shown in at least FIG. 1). A width W4 of the fifth portion 522 (also referred to herein as a fifth width) may be greater than a width W3 of the fourth portion 521 (also referred to herein as a fourth width). The width W4 of the fifth portion 522 may satisfy W3<W4≤4W3. A bridge area 521a having a width (e.g., width in the horizontal direction as described herein) increasing from the width W3 to the width W4 is further disposed between the fourth portion 521 and the fifth portion 522. The width of the bridge area 521a may increase from the width W3 at a position adjacent to the fourth portion 521 to the width W4 at a position adjacent to the fifth portion 522. Accordingly, the second wiring 520 may be further understood to include the bridge area 521a. Similarly, a bridge area 523a having a gradually decreasing width (e.g., width in the horizontal direction as described herein) is further disposed between the fifth portion 522 and the sixth portion 523. Accordingly, the second wiring 520 may be further understood to include the bridge area 523a.

By increasing the width of the second wiring 520 positioned at the boundary between the mounting area R and the non-mounting area E, cracks due to warpage differences may be reduced or prevented between the mounting area and the non-mounting area.

Figure 8:
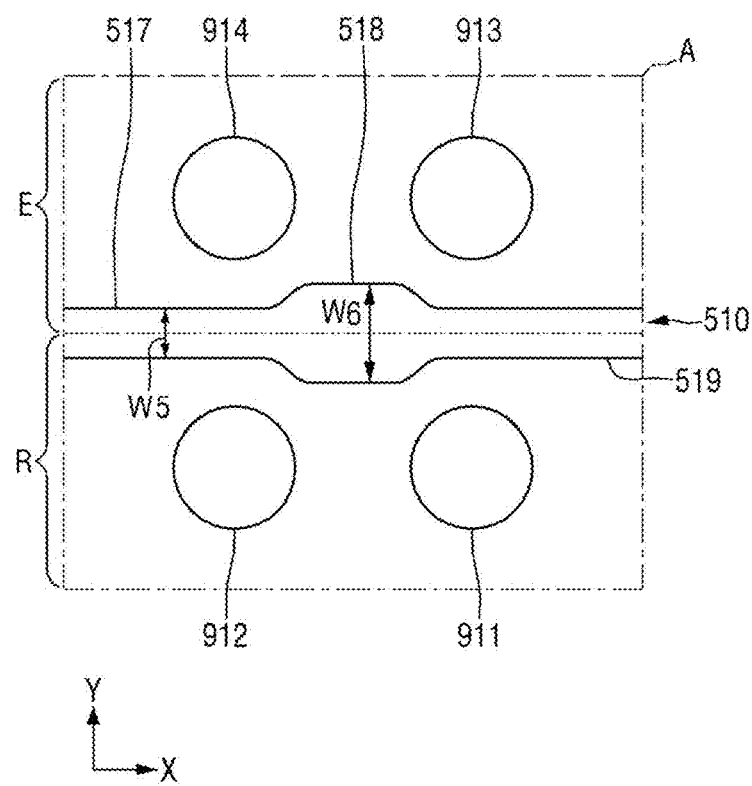
FIG. 8 is a bottom view illustrating a semiconductor package according to some example embodiments of the present inventive concepts.

FIG. 8 is a bottom view illustrating a semiconductor package according to some example embodiments of the present inventive concepts. For simplicity of description, the following description will focus on differences from the description with reference to FIGS. 1 and 2.

Referring to FIG. 8, the first wiring 510 may be disposed to be elongated in the x-axis direction along the boundary between the mounting area R and the non-mounting area E (e.g., along the edge of the semiconductor chip). The first wiring 510 includes portions 517, 518, and 519 connected to each other. A width W6 of the portion 518 may be greater than a width W5 of the portions 517 and 519. Referring to FIGS. 7 and 8, in some example embodiments the second wiring 520 may include a fourth portion 521, a fifth portion 522, and a sixth portion 523 connected to each other as shown in FIG. 7 and extending in the x-axis direction along the boundary between the mounting area R and the non-mounting area E (e.g., along the edge of the semiconductor chip 100, in parallel with the edge of the semiconductor chip 100) while overlapping the edge of the semiconductor chip 100 (e.g., overlapping in the z-axis direction, also referred to herein as the vertical direction) similarly to the first wiring 510 as shown in FIG. 9.

Figure 9:
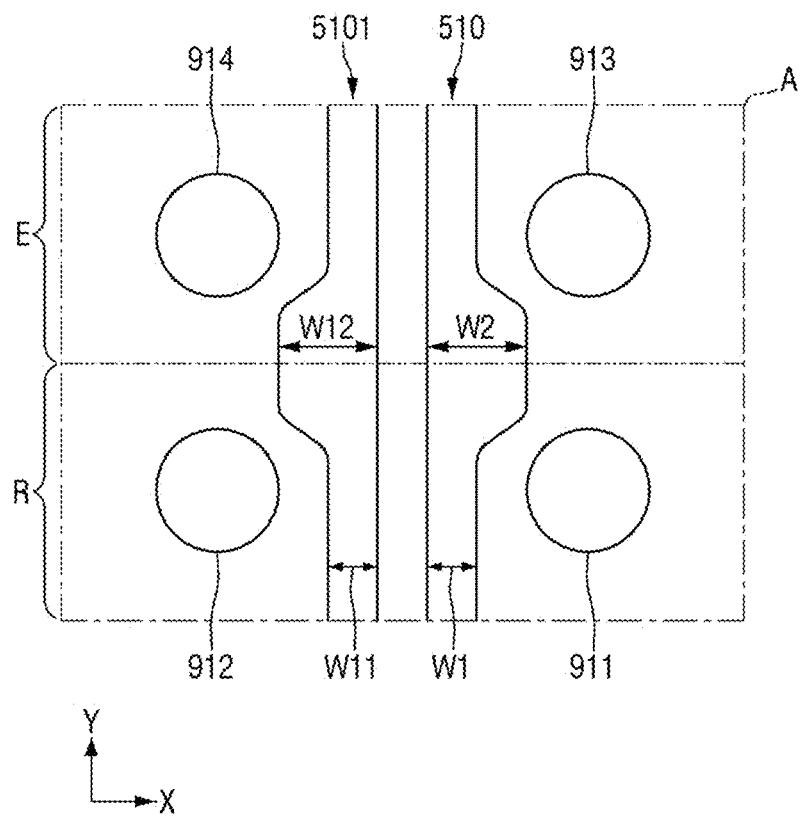
FIG. 9 is a bottom view illustrating a semiconductor package according to some example embodiments of the present inventive concepts.

FIG. 9 is a bottom view illustrating a semiconductor package according to some example embodiments of the present inventive concepts. For simplicity of description, the following description will focus on differences from the description with reference to FIGS. 1 and 2.

Referring to FIG. 9, in the semiconductor package according to some example embodiments of the present inventive concepts, two wirings 510 and 5101 may pass side by side between the first terminal 911 and the second terminal 912, and between the third terminal 913 and the fourth terminal 914.

As illustrated, each of the wirings 510 and 5101 may increase in width at the boundary between the mounting area R and the non-mounting area E. That is, the width of the wiring 510 increases from W1 to W2 in the area overlapping the edge of the semiconductor chip 100. The width of the wiring 5101 also increases from W11 to W12 in the area overlapping the edge of the semiconductor chip 100. For example, the width W2 of the wiring 510 increases in the opposite direction of the wiring 5101 (e.g., +x-axis direction), and the width W12 of the wiring 5101 increases in the opposite direction of the wiring 510. (e.g., −x-axis direction).

Figure 10:
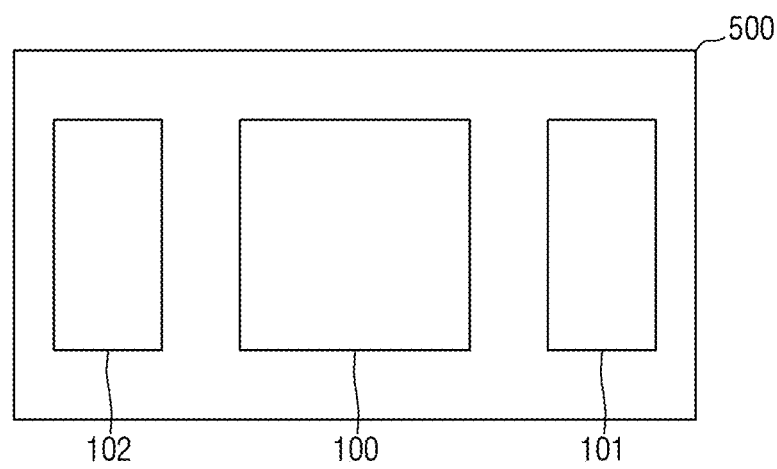
FIG. 10 is a conceptual diagram illustrating a semiconductor package according to some example embodiments of the present inventive concepts.

FIG. 10 is a conceptual diagram illustrating a semiconductor package according to some example embodiments of the present inventive concepts.

Referring to FIG. 10, stiffeners 101 and 102 may be further disposed on one surface of the substrate 500 to be spaced apart from (e.g., isolated from direct contact with) the semiconductor chip 100. The stiffeners 101 and 102 may be in the form of, for example, dummy chips. That is, the stiffeners 101 and 102 may be disposed in the non-mounting area E of the substrate 500. Although two stiffeners are illustrated in FIG. 10, the present inventive concepts are not limited thereto. One or three or more stiffeners may be used.

By disposing the stiffeners 101 and 102 in the non-mounting area E, warpage of the substrate that may occur in the non-mounting area E may be reduced or minimized.

Meanwhile, although not illustrated separately, when the first wiring (see 510 in FIG. 2) or the second wiring (see 520 in FIG. 7) passes through a position overlapping the edges of the stiffeners 101 and 102, the width of the portion in the first wiring 510 and the second wiring 520 overlapping the edges of the stiffeners 101 and 102 may be increased compared to other portions.

Figure 11:
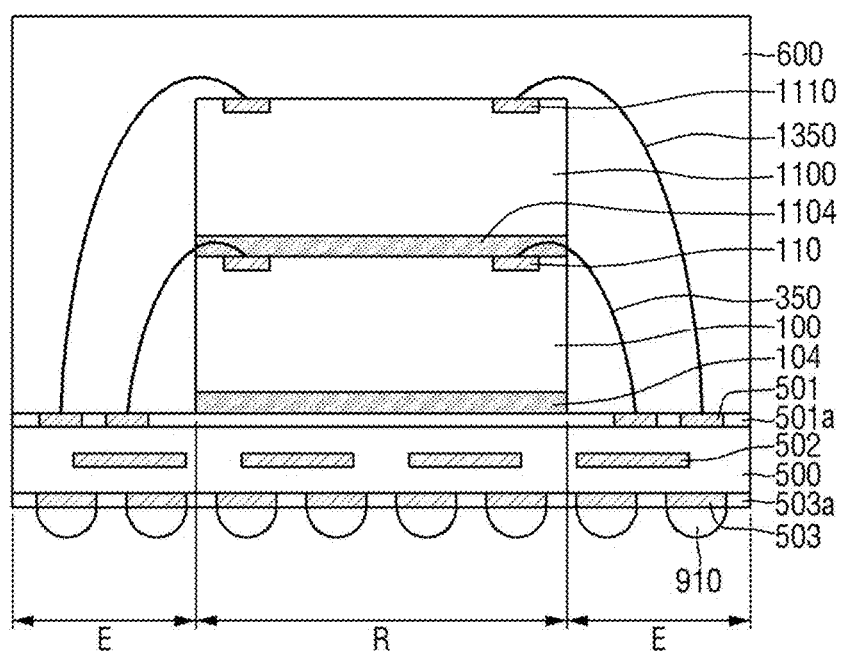
FIG. 11 is a cross-sectional view illustrating a semiconductor package according to some example embodiments of the present inventive concepts.

FIG. 11 is a cross-sectional view illustrating a semiconductor package according to some example embodiments of the present inventive concepts.

Referring to FIG. 11, in the semiconductor package according to some example embodiments of the present inventive concepts, a plurality of semiconductor chips 100 and 1100 may be stacked. The semiconductor chip 100 disposed at the bottom may be, for example, a processor chip, and the semiconductor chip 1100 disposed at the top may be, for example, a memory chip. An adhesive film 1104 may be disposed between the semiconductor chip 100 and the semiconductor chip 1100 to fix the semiconductor chip 1100 on the semiconductor chip 100. The pad 110 of the semiconductor chip 100 may be connected to the substrate through the wire 350, and a pad 1110 of the semiconductor chip 1100 may be connected to the substrate through a wire 1350.

As described above, any one of the plurality of wirings 501, 502, and 503 of the substrate 500 is disposed to cross the mounting area R and the non-mounting area E. For example, the width of the lowermost wiring increases at the boundary between the mounting area R and the non-mounting area E.

Figure 12:
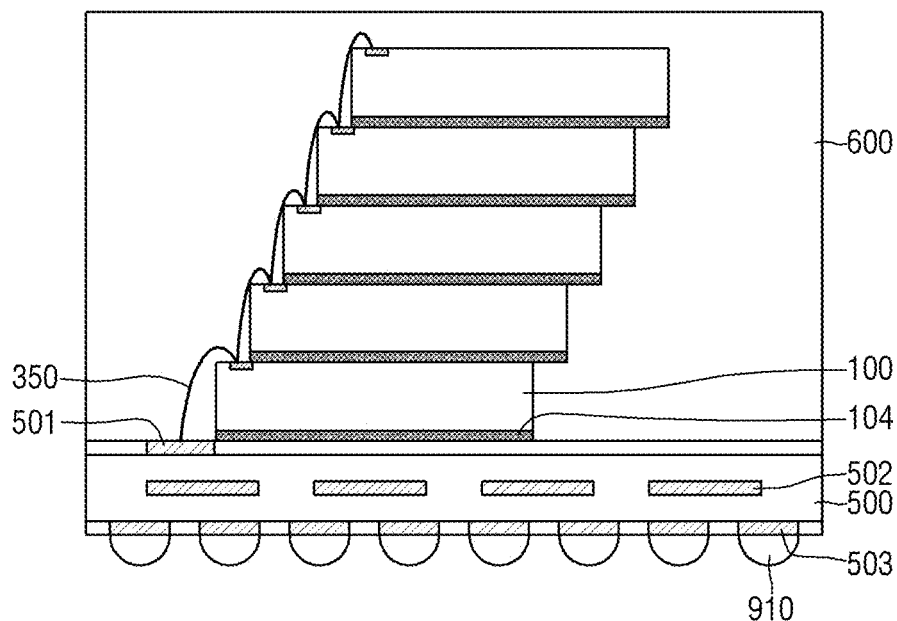
FIG. 12 is a cross-sectional view illustrating a semiconductor package according to some example embodiments of the present inventive concepts.

FIG. 12 is a cross-sectional view illustrating a semiconductor package according to some example embodiments of the present inventive concepts.

Referring to FIG. 12, in the semiconductor package according to some example embodiments of the present inventive concepts, a plurality of semiconductor chips 100 may be stacked.

The plurality of semiconductor chips 100 may be stacked in the form of a staircase going up to the right (or a staircase going down to the left). By stacking in a staircase form as described above, the pad of each semiconductor chip 100 may be exposed, and a plurality of exposed pads may be electrically connected to the substrate 500 through the wires 350.

As described above, any one of the plurality of wirings 501, 502, and 503 of the substrate 500 is disposed to cross the mounting area R and the non-mounting area E. For example, the width of the lowermost wiring increases at the boundary between the mounting area R and the non-mounting area E.

Figure 13:
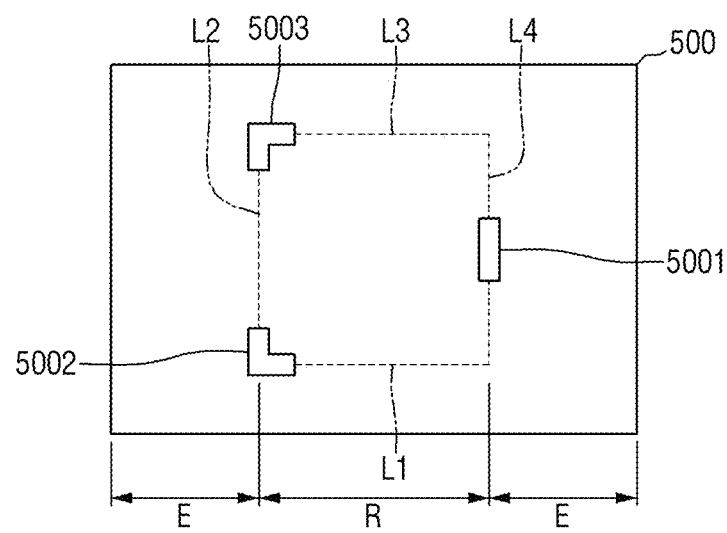
FIG. 13 is a view illustrating a substrate for a semiconductor package according to some example embodiments of the present inventive concepts.

FIG. 13 is a view illustrating a substrate for a semiconductor package according to some example embodiments of the present inventive concepts.

Referring to FIG. 13, the substrate 500 for a semiconductor package according to some example embodiments of the present inventive concepts is a substrate used in the semiconductor package illustrated with reference to FIGS. 1 to 12.

On the substrate 500 for a semiconductor package, wherein a plurality of wiring layers and insulating layers are alternately arranged in the substrate 500, a plurality of alignment marks 5001, 5002, and 5003 defining the mounting area R in which a semiconductor chip (see 100 in FIG. 1) is to be mounted, are disposed. Although the three alignment marks 5001, 5002, and 5003 are illustrated in FIG. 11, the present inventive concepts are not limited thereto. For example, four or more alignment marks may be provided.

Imaginary lines L1, L2, L3, and L4 may be drawn by the adjacent alignment marks 5001, 5002, and 5003. For example, the line L2 connecting the alignment marks 5002 and 5003, the line L4 passing through the alignment mark 5001, the line L1 connecting the alignment marks 5001 and 5002, and the line L3 connecting the alignment marks 5001 and 5003 may be drawn. An area defined by the imaginary lines L1, L2, L3, and L4 may be the mounting area R. Although the semiconductor chip 100 is not mounted on the mounting area R, the mounting area R may be recognized using the alignment marks 5001, 5002, and 5003.

One of the plurality of wirings 501, 502, and 503 of the substrate 500 (e.g., see first wiring 510 of FIG. 2) is disposed to cross the mounting area R and the non-mounting area E. The width of the lowermost wiring increases at the boundary between the mounting area R and the non-mounting area E.

Figure 14:
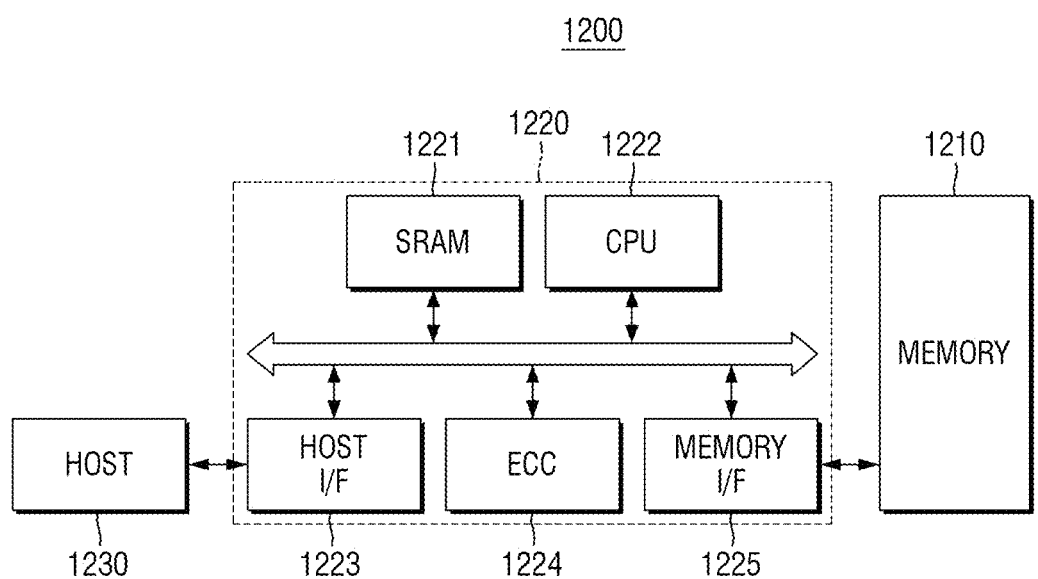
FIG. 14 is a block diagram illustrating a memory card including a semiconductor package according to some example embodiments of the present inventive concepts.

FIG. 14 is a block diagram illustrating a memory card including a semiconductor package according to some example embodiments of the present inventive concepts.

Referring to FIG. 14, the semiconductor packages 1000 according to some example embodiments may be applied to (e.g., included in) a memory card 1200.

The memory card 1200 may include a memory controller 1220 that controls data exchange between a host 1230 and a memory 1210. An SRAM 1221 may be used as an operation memory of a central processing unit 1222. A host interface 1223 may include a data exchange protocol of the host 1230 connected to the memory card 1200. An error correction code 1224 may detect and correct an error included in data read from the memory 1210. A memory interface 1225 may interface with the memory 1210. The central processing unit 1222 may perform various control operations for data exchange of the memory controller 1220.

For example, at least one of the memory 1210 and the central processing unit 1222 may include at least one of the semiconductor packages 1000 according to some example embodiments of the present inventive concepts.

Figure 15:
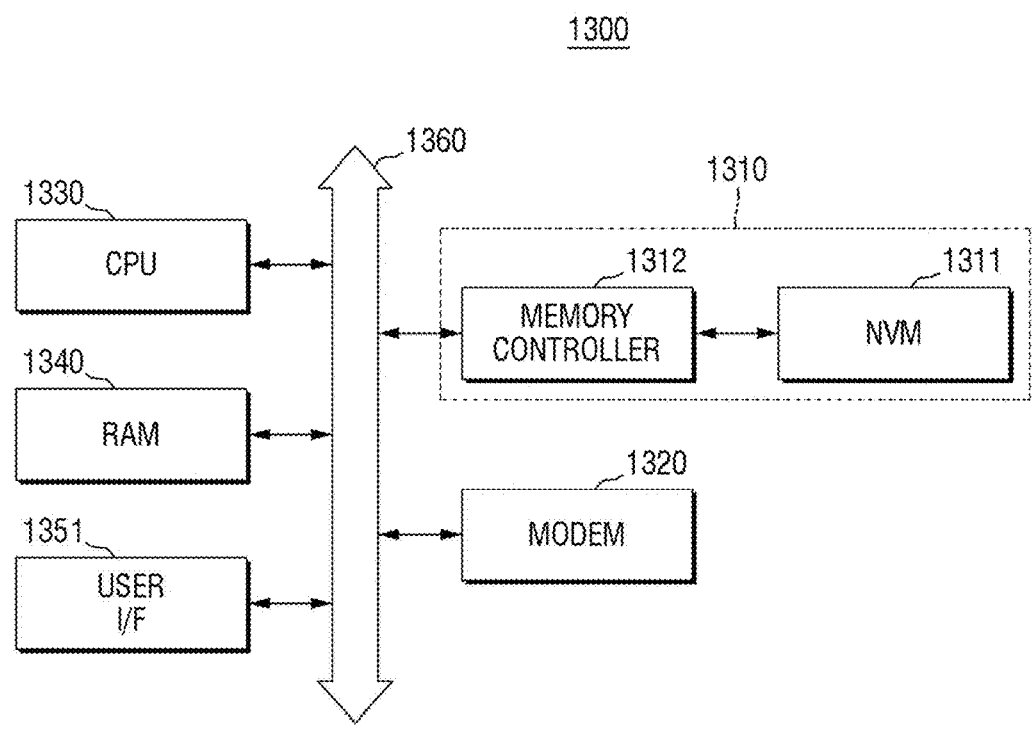
FIG. 15 is a block diagram illustrating an information processing system in which a semiconductor package according to some example embodiments of the present inventive concepts is included.

FIG. 15 is a block diagram illustrating an information processing system to which a semiconductor package according to some example embodiments of the present inventive concepts is applied.

Referring to FIG. 15, the semiconductor packages 1000 according to some example embodiments of the present inventive concepts may be applied to (e.g., included in) an information processing system 1300.

The information processing system 1300 may include a mobile device or a computer. The information processing system 1300 may include a memory system 1310 electrically connected to a system bus 1360, a modem 1320, a central processing unit 1330, a RAM 1340, a user interface 1351, and the like. The memory system 1310 may include a memory 1311 and a memory controller 1312, and may have the same or substantially the same configuration as the memory card 1200 of FIG. 14. In addition, at least one of the central processing unit 1330 and the RAM 1340 may include at least one of the semiconductor packages 1000 according to some example embodiments of the present inventive concepts.

Data processed by the central processing unit 1330 or data inputted from the outside may be stored in the memory system 1310. The information processing system 1300 may be provided as a memory card, a solid state disk, a camera image sensor, and other application chipsets. For example, the memory system 1310 may be configured as a solid state disk (SSD), and in this case, the information processing system 1300 may stably and reliably store a large amount of data in the memory system 1310.

As described herein, any devices, packages, systems, electronic devices, blocks, modules, units, controllers, circuits, and/or portions thereof according to any of the example embodiments, and/or any portions thereof (including, without limitation, semiconductor package 1000, memory card 1200, memory controller 1220, host 1230, memory 1210, SRAM 1221, central processing unit 1222, host interface 1223, error correction code 1224, memory interface 1225, information processing system 1300, memory system 1310, modem 1320, central processing unit 1330, RAM 1340, user interface 1351, memory 1311, memory controller 1312, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU) an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, packages, systems, electronic devices, blocks, modules, units, controllers, circuits, and/or portions thereof according to any of the example embodiments, and/or any portions thereof.

Any of the memories and/or storage devices described herein, including, without limitation, SRAM 1221, memory 1210, memory system 1310, RAM 1340, memory 1311 (which may be a non-volatile memory), or the like, may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

In concluding the detailed description, those skilled in the art will appreciate that many variations and modifications can be made to some example embodiments without substantially departing from the principles of the present inventive concepts. Therefore, some example embodiments of the inventive concepts are used in a generic and descriptive sense only and not for purposes of limitation.

What is claimed is:

1. A semiconductor package, comprising:
    a substrate;
    a semiconductor chip on a first surface of the substrate; and
    a plurality of external connection terminals on a second surface of the substrate, the first and second surfaces being opposite surfaces of the substrate,
    wherein the substrate includes a plurality of wirings configured to electrically connect the semiconductor chip and the plurality of external connection terminals,
    wherein the plurality of wirings include a first wiring, and the first wiring includes a first portion and a second portion connected to each other, the first portion overlapping with the semiconductor chip in a vertical direction that is perpendicular to the first surface of the substrate and the second portion overlapping an edge of the semiconductor chip in the vertical direction,
    wherein the first portion and the second portion are at a same vertical level,
    wherein the first portion has a first width and the second portion has a second width, and the second width of the second portion is greater than the first width of the first portion,
    wherein the plurality of wirings include a second wiring, the second wiring at a different vertical level than the first wiring in the vertical direction, the second wiring including a third portion and a fourth portion connected to each other,
    wherein the third portion and the fourth portion extend horizontally along the edge of the semiconductor chip while overlapping the edge of the semiconductor chip in the vertical direction,
    wherein the third portion has a third width and the fourth portion has a fourth width, and wherein the fourth width of the fourth portion is greater than the third width of the third portion.

2. The semiconductor package of claim 1, wherein the substrate includes a mounting area on which the semiconductor chip is mounted, and the first wiring extends from a position overlapping the mounting area in the vertical direction to a position not overlapping the mounting area in the vertical direction.

3. The semiconductor package of claim 1, wherein the first wiring includes a bridge area having a width that gradually increases from the first width to the second width between the first portion and the second portion.

4. The semiconductor package of claim 1, wherein
the first width of the first portion is W1 and the second width of the second portion is W2, and
W1<W2≤4W1 is satisfied.

5. The semiconductor package of claim 1, wherein
the plurality of external connection terminals include a first terminal and a second terminal,
the first portion of the first wiring is between the first terminal and the second terminal, and
the second portion of the first wiring is offset from an axis extending between the first terminal and the second terminal.

6. The semiconductor package of claim 5, wherein
the first width of the first portion is W1,
a distance between the first portion and the first terminal is G1, and
0.5W1≤G1≤1.5W1 is satisfied.

7. The semiconductor package of claim 5, wherein
the first width of the first portion is W1,
a distance between the second portion and the first terminal is G2, and
0.5W1≤G2≤1.5W1 is satisfied.

8. The semiconductor package of claim 5, wherein
the plurality of external connection terminals further include a third terminal and a fourth terminal,
the first wiring further extends between the third terminal and the fourth terminal in addition to extending between the first terminal and the second terminal,
the first wiring further includes a fifth portion connected to the second portion,
the fifth portion is between the third terminal and the fourth terminal, and
the second portion is located in a space surrounded by the first to fourth terminals.

9. The semiconductor package of claim 8, wherein
the first wiring is directly connected to a fifth terminal among the plurality of external connection terminals,
the fifth portion connects the second portion and the fifth terminal,
the fifth portion has a fifth width, and
the fifth width of the fifth portion is smaller than the second width of the second portion.

10. The semiconductor package of claim 1, wherein
the plurality of wirings are located in a plurality of layers, and
the first wiring is at a lowermost layer among the plurality of layers.

11. The semiconductor package of claim 1, wherein
the plurality of wirings are located in a plurality of layers, and
the first wiring is at a layer higher than a lowermost layer among the plurality of layers.

12. The semiconductor package of claim 1, further comprising a stiffener on one surface of the substrate and isolated from direct contact with the semiconductor chip.

13. A semiconductor package, comprising:
a substrate including a mounting area;
a semiconductor chip in the mounting area, on a first surface of the substrate;
a plurality of pads outside the mounting area, on the first surface of the substrate, and connected to the semiconductor chip through wires; and
a plurality of external connection terminals on a second surface of the substrate, the plurality of external connection terminals including first and second terminals overlapping the mounting area in a vertical direction that is perpendicular to the first surface of the substrate, and third and fourth terminals not overlapping the mounting area in the vertical direction, the first and second surfaces being opposite surfaces of the substrate,
wherein the substrate includes a plurality of wirings configured to electrically connect the plurality of pads and the plurality of external connection terminals,
wherein the plurality of wirings include a first wiring, and the first wiring extends from a position overlapping the mounting area in the vertical direction to a position not overlapping the mounting area in the vertical direction,
wherein the first wiring includes a first portion, a second portion and a third portion connected to each other, the first portion overlapping with the mounting area in the vertical direction and being between the first terminal and the second terminal, the third portion being between the third terminal and the fourth terminal, the second portion being in a space surrounded by the first to fourth terminals,
wherein the first portion has a first width, the second portion has a second width, and the third portion has a third width, and the second width of the second portion is greater than the first width of the first portion and the third width of the third portion,
wherein the first portion and the second portion are at a same vertical level,
wherein the plurality of wirings include a second wiring, the second wiring at a different vertical level than the first wiring in the vertical direction, the second wiring including a fourth portion and a fifth portion connected to each other,
wherein the fourth portion and the fifth portion extend horizontally along an edge of the semiconductor chip while overlapping the edge of the semiconductor chip in the vertical direction,
wherein the fourth portion has a fourth width and the fifth portion has a fifth width, and
wherein the fifth width of the fifth portion is greater than the fourth width of the fourth portion.

14. The semiconductor package of claim 13, wherein
the first width of the first portion is W1 and the second width of the second portion is W2, and
W1<W2≤4W1 is satisfied.

15. The semiconductor package of claim 13, wherein
the first width of the first portion is W1,
a distance between the first portion and the first terminal is G1, and
0.5W1≤G1≤1.5W1 is satisfied.

16. The semiconductor package of claim 13, wherein
the plurality of wirings are located in a plurality of layers, and
the first wiring is at a lowermost layer among the plurality of layers.

17. A substrate in which a plurality of wiring layers and insulating layers are alternately arranged, the substrate comprising:
- a plurality of alignment marks on the substrate and defining a mounting area in which a semiconductor chip is to be mounted,
- wherein the plurality of wiring layers include a first wiring, and the first wiring extends from a position overlapping the mounting area in a vertical direction that is perpendicular to a first surface of the substrate to a position not overlapping the mounting area in the vertical direction,
- wherein the first wiring includes a first portion and a second portion connected to each other, the first portion overlapping with the semiconductor chip in the vertical direction, the second portion being at a position overlapping an edge of the mounting area in the vertical direction,
- wherein the first portion has a first width and the second portion has a second width, and the second width of the second portion is greater than the first width of the first portion,
- wherein the first portion and the second portion are at a same vertical level,
- wherein the plurality of wiring layers include a second wiring, the second wiring at a different vertical level than the first wiring and including a third portion and a fourth portion connected to each other,
- wherein the third portion and the fourth portion extend horizontally along an edge of the semiconductor chip while overlapping the edge of the semiconductor chip in the vertical direction,
- wherein the third portion has a third width and the fourth portion has a fourth width, and
- wherein the fourth width of the fourth portion is greater than the third width of the third portion.

18. The substrate of claim 17, wherein the first wiring includes a bridge area having a width that increases from the first width to the second width between the first portion and the second portion.

19. The substrate of claim 17, wherein
- the first width of the first portion is W1 and the second width of the second portion is W2, and
- $W1 < W2 \leq 4W1$ is satisfied.

* * * * *